(12) United States Patent
Jung et al.

(10) Patent No.: US 11,378,607 B2
(45) Date of Patent: Jul. 5, 2022

(54) DISPLACEMENT SENSOR-COMBINED ELECTROSTATIC MEASUREMENT POTENTIAL SENSOR AND OPERATION METHOD THEREFOR

(71) Applicant: DONG IL TECHNOLOGY LTD., Gyeonggi-do (KR)

(72) Inventors: Soo Yul Jung, Gyeonggi-do (KR); Joo Hun Yun, Gyeonggi-do (KR); Jung Hyun Kim, Gyeonggi-do (KR)

(73) Assignee: DONG IL TECHNOLOGY LTD., Gyeonggi-do (KR)

( * ) Notice: Subject to any disclaimer, the term of this patent is extended or adjusted under 35 U.S.C. 154(b) by 23 days.

(21) Appl. No.: 16/960,807

(22) PCT Filed: Jan. 11, 2018

(86) PCT No.: PCT/KR2018/000554
§ 371 (c)(1),
(2) Date: Jul. 8, 2020

(87) PCT Pub. No.: WO2019/139188
PCT Pub. Date: Jul. 18, 2019

(65) Prior Publication Data
US 2020/0400731 A1    Dec. 24, 2020

(51) Int. Cl.
*G01R 29/12* (2006.01)
*G01S 15/10* (2006.01)

(52) U.S. Cl.
CPC .............. *G01R 29/12* (2013.01); *G01S 15/10* (2013.01)

(58) Field of Classification Search
CPC ................................ G01R 29/12; G01S 15/10
See application file for complete search history.

(56) References Cited

FOREIGN PATENT DOCUMENTS

| JP | 03-295475 A | 12/1991 |
|---|---|---|
| JP | 04-194670 A | 7/1992 |

(Continued)

OTHER PUBLICATIONS

English Translation for PCT/KR2018/000554 dated Oct. 5, 2018.
(Continued)

*Primary Examiner* — Noam Reisner
(74) *Attorney, Agent, or Firm* — Millen, White, Zelano & Branigan, PC; Ryan Pool

(57) ABSTRACT

Disclosed are a displacement sensor-combined electrostatic measurement potential sensor, and an operation method therefor, wherein a displacement sensor and an electrostatic measurement potential sensor are provided in one device, and operations thereof are linked; a distance to an electrified body measured by the displacement sensor is stored in a main controller to automatically correct a measurement value of the amount of static electricity obtained by the potential sensor; a change in capacitance that the displacement sensor affects with respect to the potential sensor is applied to correction of an error in a result value measured by the potential sensor, so that it is possible to solve the problem of malfunction according to detection of the electrified body, wherein the distance thereto is changed, and accurately measure the potential; and by manufacturing the device in a small size, easy use is achieved and manufacturing and installation costs are reduced.

3 Claims, 4 Drawing Sheets

(56) References Cited

FOREIGN PATENT DOCUMENTS

| JP | 07-244103 A | 9/1995 | |
|----|-------------|--------|---|
| KR | 2005-0064152 A | 6/2005 | |
| KR | 2007-0018671 A | 2/2007 | |
| KR | 20100086924 A * | 8/2010 | ............. G01R 29/12 |

OTHER PUBLICATIONS

English Abstract of JPH04-194670, Publication Date: Jul. 14, 1992.
English Abstract of JPH07-244103, Publication Date: Sep. 19, 1995.
English Abstract of JPH03-295475, Publication Date: Dec. 26, 1991.

* cited by examiner

DISPLACEMENT SENSOR-COMBINED ELECTROSTATIC MEASUREMENT POTENTIAL SENSOR AND OPERATION METHOD THEREFOR

TECHNICAL FIELD

The present invention relates to a displacement sensor-combined electrostatic measurement potential sensor, and an operation method therefor. More particularly, the present invention relates to a displacement sensor-combined electrostatic measurement potential sensor, and an operation method therefor, wherein a displacement sensor measuring a distance and an electrostatic measurement potential sensor for ESD measurement are integrated in one instrument to be provided in a device, and operations of the sensors are linked so as to solve inconvenience of a conventional electrostatic measurement sensor of which a result value obtained by measuring electrostatic potential is changed according to a change in distance between the electrified body and the potential sensor; the distance to the electrified body measured by the displacement sensor is stored in a main controller to automatically correct a measurement value of the amount of static electricity obtained by the potential sensor; the change in capacitance that the displacement sensor affects with respect to the potential sensor is applied to correction of an error in a result value measured by the potential sensor, so that it is possible to solve the problem of malfunction according to detection of the electrified body to be measured, such as a moving object to be measured, or a vinyl wound around a roll, wherein the distance thereto is changed, and accurately measure the potential; and by manufacturing the device in a small size, easy use is achieved and manufacturing and installation costs are reduced.

BACKGROUND ART

In general, static electricity refers to an electric charge that is charged in a stationary state on an object or in a state in which the movement is sluggish, which means stationary electricity. When an object approaches or comes into contact with an electrified body charged with such static electricity, static electricity immediately moves to the object and electric discharge occurs, so that a high voltage is generated. In a serious case, sparks may occur. The discharge energy of static electricity causes destruction of industrial equipment and products, fire explosion, electric shock, dust adsorption, and the like at industrial sites, so that human injuries occur and reliability and productivity of products are deteriorated due to electromagnetic noise. In particular, at industrial sites where a lot of flammable materials or textile products are handled, even small sparks caused by static electricity may cause major accidents, such as explosions, or fires. Therefore, special care is required. For this reason, in an area with a risk of explosion risk or an area where precision electronic-device manufacturing factories, large pipes, storage tanks, textile factories, or the like are located, static-electricity meters measuring surface resistance, volume resistance, surface voltage, and the like are used to measure static electricity generated in equipment, workplace, and the like. A static-voltage meter is widely used to measure a static voltage generated by static electricity with which one electrified body is charged, and to calculate the amount of electric charge.

In a static-voltage measurement method generally used in the conventional static-electricity meter, as shown in FIG. 1, a vibrating Kelvin sensor, wherein the distance to the surface (surface under test) of the electrified body of which the static voltage is to be measured is kept constant by a determined numerical value, is positioned facing the surface of the electrified body. Herein, by the surface of the electrified body discharging static electricity (ESD; electrostatic discharge), Sin current according to the potential difference between the surface of the electrified body and the vibrating Kelvin sensor is induced to the vibrating Kelvin sensor. The potential of the surface of the electrified body may be measured using the size of the induced Sin current, and the equation is as shown in Equation 1 below.

$$i = v\frac{dC}{dt} = v\frac{d}{dt}\frac{\varepsilon_r\varepsilon_0 S(t)}{D} = \frac{v\varepsilon_r\varepsilon_0}{D}\frac{d}{dt}(S_0 + S_1\sin\omega t) \quad \text{[Equation 1]}$$

However, in the conventional static-voltage measurement method, it is essential that the distance between an electrostatic measurement potential sensor and a surface of an electrified body to be measured is kept constant in order to accurately measure electrostatic discharge (ESD) and the amount of electric field. Conventional methods to solve this include: a method of placing the electrostatic measurement potential sensor to be close to the electrified body by identifying that LED lamp rays of two LED lamps are focused into one, with the naked eye; a method of inputting an actually measured distance between the potential sensor and the electrified body; and a method of correcting the electrostatic measurement potential sensor so that the sensor recognizes the electrified body, with a constant distance therebetween by using a separate sensor measuring the distance, as shown in FIG. 2. However, in this case, the measurement of potential is inaccurate due to manual operation and distance measurement by human operation and determination. In addition, there are an increase in installation cost due to purchase of separate equipment, a problem of adding an operation process for maintaining the distance during use, and an inconvenience of increasing the time required for the final measurement.

DISCLOSURE

Technical Problem

Accordingly, the present invention has been made keeping in mind the problems that when the distance between the surface of the electrified body to be measured and the electrostatic measurement potential sensor is changed, compensation for the distance needs to be performed manually; and that when a distance measurement sensor and an electrostatic measurement potential sensor are operated individually, measurement of the potential is inaccurate and installation cost increases. The present invention is intended to provide a technology in which by using a displacement sensor-combined electrostatic measurement potential sensor that is a combination of an ultrasonic distance measurement sensor and an electrostatic measurement potential sensor, the distance is automatically measured and compensation for a value obtained by measuring the amount of static electricity according to the distance is performed, whereby user inconvenience is eliminated and the potential is accurately measured regardless of the distance between the surface of the electrified body and the electrostatic measurement potential sensor.

Technical Solution

In order to achieve the above objectives, the present invention provides a displacement sensor-combined electrostatic measurement potential sensor having a distance correction function using a displacement sensor, such as an ultrasonic sensor, or the like, and an operation method therefor, wherein a displacement sensor measuring a distance and an electrostatic measurement potential sensor for ESD measurement are integrated, so that even when the constant distance between the electrified body and the potential sensor is not maintained, information on the distance measured by the displacement sensor is applied in calculating a result value of the amount of static electricity, through a main controller. Further, the electrostatic measurement potential sensor and the displacement sensor are placed at fixed positions, so that the surface of the electrified body in a detection area to be measured by the electrostatic measurement potential sensor is affected by the displacement sensor constantly for capacitance. In addition to this effect, the sensitivity of a zero point of the electrostatic measurement potential sensor is adjusted in the manufacturing step. Accordingly, compared to the case where the displacement sensor and the potential sensor are installed or used individually, the two sensors are fixed at accurate positions and an inaccurate potential measurement value caused by the capacitance generated randomly by the displacement sensor is improved. The displacement sensor-combined electrostatic measurement potential sensor and the operation method therefor that have such effects are provided by the present invention.

Advantageous Effects

The technology of operating the displacement sensor-combined electrostatic measurement potential sensor according to the present invention solves the inconvenience of the user who has to input the actually measured distance to correct the potential measurement value according to the change in distance, and also solves the problem that installation cost increases and potential measurement is inaccurate when an ultrasonic distance measurement sensor and an electrostatic measurement potential sensor are used individually, so that an accurate potential measurement value is obtained and the installation cost is reduced.

In addition, in order to solve the problem of malfunction according to detection of the electrified body to be measured, such as a moving object to be measured, or a vinyl wound around a roll, wherein the distance thereto is changed, which is known as a disadvantage of the electrostatic measurement potential sensor using the conventional static-voltage measurement method, even though the electrostatic measurement potential sensor does not maintain the distance to the electrified body to be measured, a result value according to the distance is obtained through automatic compensation, so that the amount of static electricity is accurately measured. Further, by manufacturing the device in a small size for ease of measurement, accuracy and convenience are achieved in use and manufacturing and purchase costs are reduced.

BEST MODE

Hereinbelow, an exemplary embodiment of the present invention will be described in detail with reference to the accompanying drawings such that the present invention can be easily embodied by those skilled in the art to which this present invention belongs. However, description of the present invention is merely an embodiment for structural or functional description, so the scope of the present invention should not be construed to be limited to the embodiment described herein. That is, since the embodiment can be variously modified and manufactured in various forms, or replacement of parts and technologies are possible, it should be understood that the scope of the present invention includes equivalents capable of implementing the technical idea.

In addition, it is not meant that all the objectives or effects presented in the present invention should be included in a particular embodiments or that only such effects should be included, so it should not be understood that the scope of the present invention is limited to a particular embodiment.

In the meantime, among the technical constructions described in the present invention and functions based such technical constructions, detailed descriptions of the technical constructions and functions that are well-known and applied in the related art will be omitted.

Figure 1:
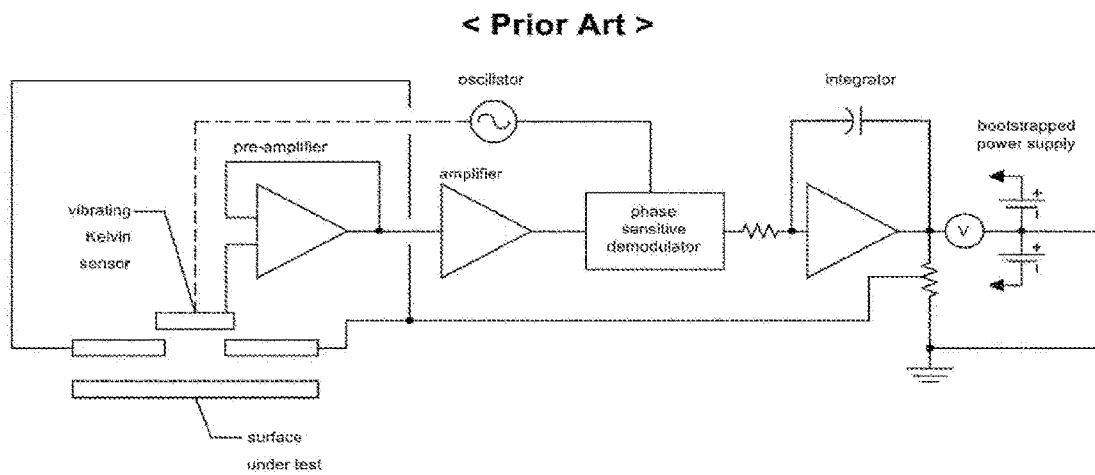
FIG. 1 is a structural diagram showing a static-electricity meter using a conventional static-voltage measurement method.
Figure 2:
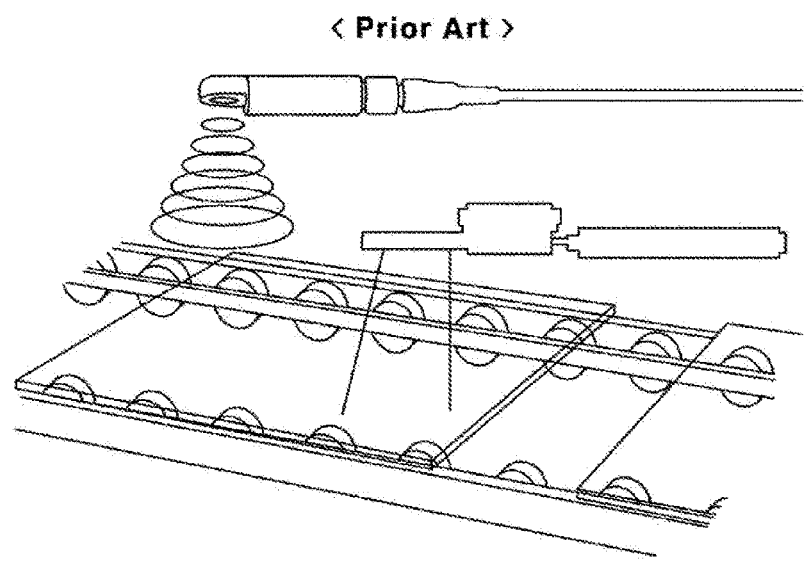
FIG. 2 is a diagram showing an embodiment of a conventional electrostatic measurement method using separate distance measurement equipment.
Figure 3:
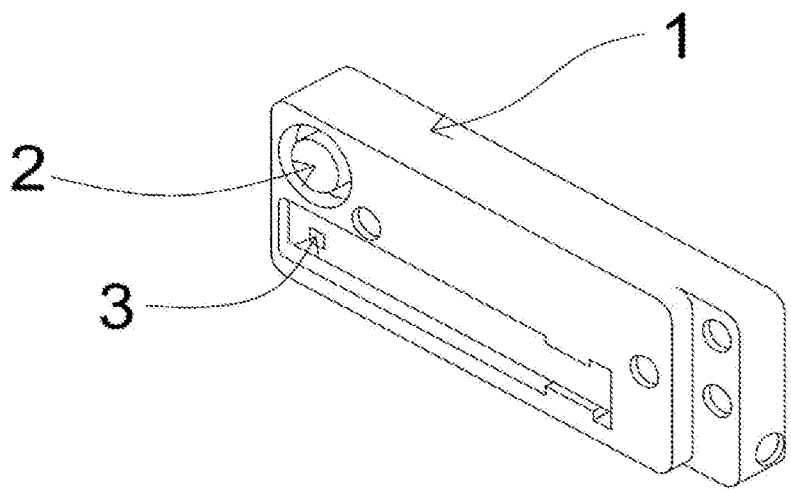
FIG. 3 is a diagram showing a configuration of a measurement unit of a displacement sensor-combined electrostatic measurement potential sensor according to an embodiment of the present invention.
Figure 4:
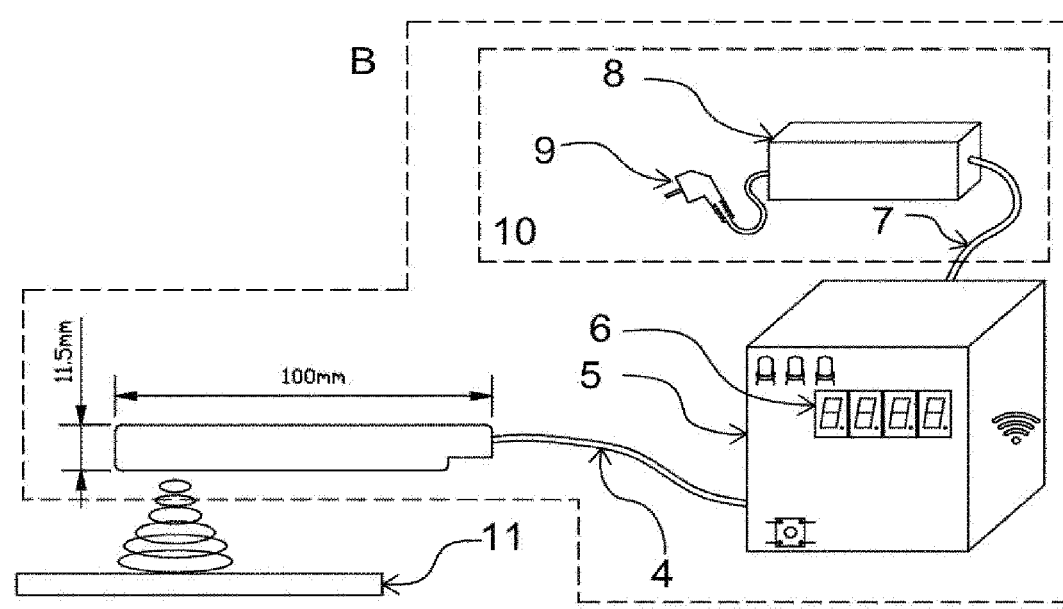
FIG. 4 is a diagram showing a configuration of a displacement sensor-combined electrostatic measurement potential sensor according to an embodiment of the present invention.

According to an embodiment of the present invention, as shown in FIGS. 3 and 4, an actual configuration of a displacement sensor-combined electrostatic measurement potential sensor (B) includes a casing 1 in the shape of a small cuboid of which the height is about 25 mm, of which the thickness is about 11.5 mm, and of which the length is about 100 mm. The upper left portion of the front side of the casing is provided with a displacement sensor 2 which is an ultrasonic sensor, or the like for sensing a position of an electrified body 11. The displacement sensor senses the distance to the electrified body 11 of which the amount of static electricity is to be measured. The lower portion of the front side of the casing is provided with a potential sensor 3 for electrostatic measurement of the electrified body 11. The lower portion of the right side of the casing is connected to a connection cable 4 in the length of about 3 m through which power is supplied to the displacement sensor 2 and the potential sensor 3 and a control signal is transmitted and received. The opposite end of the connection cable is attached to a main controller 5 in the shape of a cube, and the main controller stores and corrects a measurement value obtained by the displacement sensor 2 and the potential sensor 3. A display unit 6 displaying a result value obtained by measuring the static electricity is placed on the front side of the main controller 5. The display unit 6 may have a function of displaying a numerical value of the amount of static electricity as well as a function of displaying a warning alarm to the user as visual or auditory information when the amount of static electricity which is equal to or greater than a predetermined reference is measured at the electrified body 11. A power cable 7 through which power is supplied is connected to the rear side of the main controller 5. The opposite end of the power cable 7 is connected to the right side of a DC 24V adapter 8 in the shape of a cuboid. A plug cable 9 is attached to the left side of the DC 24V adapter 8, and enables external power to be applied.

Figure 5:
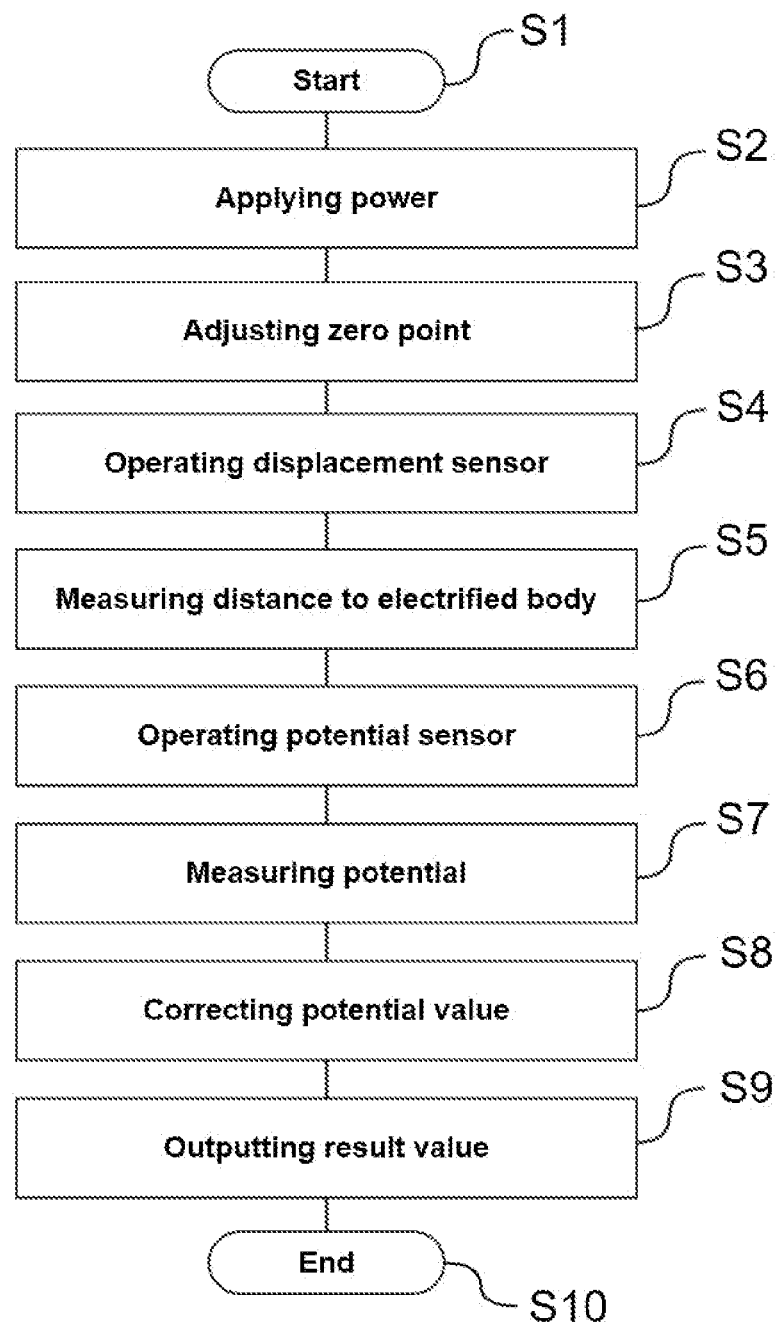
FIG. 5 is a flowchart showing an operation of a displacement sensor-combined electrostatic measurement potential sensor according to an embodiment of the present invention.

According to an embodiment of the present invention, as shown in FIG. 5, the flow of the operation of the displacement sensor-combined electrostatic measurement potential sensor is as follows. When installation of the displacement sensor-combined electrostatic measurement potential sensor is completed and preparation for operation starts at step S1, power is applied wholly to the displacement sensor-combined electrostatic measurement potential sensor at step S2. In the absence of the electrified body, a zero point is adjusted to set a measurement reference for the potential sensor at step S3. The displacement sensor operates to transmit an ultrasonic wave to the electrified body and receive an ultrasonic signal reflected back at step S4. Thus, the distance between the electrified body and the displacement sensor-combined electrostatic measurement potential sensor is measured at step S5. The electrostatic measurement potential sensor including a diaphragm positioned facing the electrified body operates at step S6. Thus, the electrostatic potential of the electrified body is measured at step S7. The main controller 5 corrects the potential value, considering the measured distance between the electrified body and the displacement sensor-combined electrostatic measurement potential sensor at step S8. A result value is output to the display unit 6 of the main controller 5 at step S9. The operation of the displacement sensor-combined electrostatic measurement potential sensor is terminated at step S10.

According to an embodiment of the present invention, the principle of the displacement sensor used in the displacement sensor-combined electrostatic measurement potential sensor will be described. As the measurement principle of the ultrasonic sensor, an ultrasonic wave transmitted from the displacement sensor transmits an ultrasonic signal from a piezoresonator, and a method of obtaining information on a target object by measuring the time required for an ultrasonic pulse transmitted from the ultrasonic sensor to reflect off the surface of the object to be measured and return to the ultrasonic sensor is used. However, in calculating the distance by measuring the delay time that is takes the ultrasonic wave to be transmitted and return, the sound velocity (v) of the ultrasonic wave according to the temperature (t) in the air is calculated through compensation as shown in Equation 2 below.

$$v(m/s) = 331.5 + 0.6t \qquad \text{[Equation 2]}$$

According to an embodiment of the present invention, the principle of operation of the potential sensor used in the displacement sensor-combined electrostatic measurement potential sensor will be described. The diaphragm of the potential sensor, and an area where the electrified body and the potential sensor face each other, that is, the diaphragm vibrates from side to side, and the signal changes into the shape of a sine wave (sinusoidal), so that a Sin current is induced to the potential sensor. Herein, the larger the potential of the electrified body, the larger the size of induced current. The potential of the electrified body is calculated according to Equation 1 described above in the background art of the invention.

Figure 6:
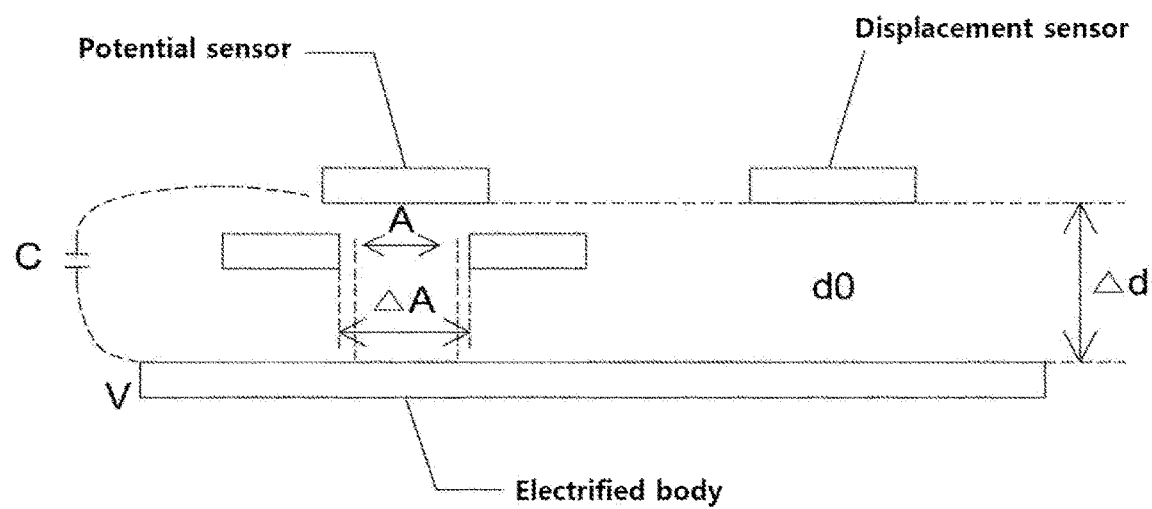
FIG. 6 is a structural diagram to describe a principle of correcting a displacement sensor-combined electrostatic measurement potential sensor according to an embodiment of the present invention.

According to a preferred embodiment of the present invention, the principle of correcting the result value used in the displacement sensor-combined electrostatic measurement potential sensor will be described below. As shown in FIG. 6, assuming that the voltage of the electrified body is V and the distance to the electrified body measured by the displacement sensor is d0 and the area in which the electrified body and the potential sensor face each other is A, a capacitor component between the electrified body and the potential sensor is as shown in Equation 3.

$$C = e^* A/d0 \qquad \text{[Equation 3]}$$

The current induced to the potential sensor is as shown in Equation 4.

$$I = C^* V \qquad \text{[Equation 4]}$$

The amount of the change in the capacitor component positioned between the electrified body and the potential sensor which is caused by the diaphragm of the potential sensor is as shown in Equation 5.

$$\Delta C = e^* \Delta A/d0 \qquad \text{[Equation 5]}$$

The amount of the change in the current induced by the diaphragm of the potential sensor is as shown in Equation 6.

$$\Delta I = \Delta C^* V \qquad \text{[Equation 6]}$$

When the distance between the electrified body and the potential sensor is constant and the voltage of the electrified body is changed from V to V1, Equation 8 is obtained from Equation 6 and Equation 7.

$$V1 = \Delta I1/\Delta C \qquad \text{[Equation 7]}$$

$$V1 = V^* \Delta I1/\Delta I \qquad \text{[Equation 8]}$$

Equation 8 represents that through V and ΔI initially measured, the voltage V1 of the electrified body is calculated from ΔI1 measured by the potential sensor.

When the voltage of the electrified body is constant and the distance between the electrified body and the potential sensor is changed by d, Equation 9 is obtained.

$$\Delta C1 = e^* \Delta A/(d0+d) \qquad \text{[Equation 9]}$$

The voltage obtained with the distance d0 to the electrified body is as shown in Equation 10.

$$V = \Delta I/\Delta C = d0^* \Delta i/e^* \Delta A \qquad \text{[Equation 10]}$$

The voltage obtained by applying the changed distance d between the electrified body and the potential sensor to Equation 10 is as shown in Equation 11.

$$V = \Delta I1/\Delta C1 = (d0+d)^* \Delta i1/e^* \Delta A \qquad \text{[Equation 11]}$$

From Equation 10 and Equation 11, Equation 12 may be obtained.

$$\Delta I = (1+d/d0)^* \Delta I1 \qquad \text{[Equation 12]}$$

The voltage of the electrified body is obtained through the amount of the change in the current, and thus Equation 12 is represented into Equation 13.

$$V = (1+d/d0)^* V1 \qquad \text{[Equation 13]}$$

According to Equation 13, the voltage V1 measured by the potential sensor with the distance changed by d is corrected to the voltage V of the electrified body which is accurate regardless of change in distance, and a resulting value is output.

In addition, in the case where the ultrasonic sensor is installed in the measurement area of the potential sensor, the ultrasonic sensor affects the potential value of the potential sensor. Considering the influence of the operation of the ultrasonic wave displacement sensor, correction of a result value and a calculation method are set in the manufacturing process, whereby the user may obtain the accurately measured potential.

INDUSTRIAL APPLICABILITY

A displacement sensor-combined electrostatic measurement potential sensor having a distance correction function using an ultrasonic sensor according to the present invention is an industrially applicable invention because it is possible to repeatedly manufacture the same products in the industry of manufacturing general electrostatic measurement devices.

The invention claimed is:

1. A displacement sensor-combined electrostatic measurement potential sensor having a distance correction function using an ultrasonic sensor, the displacement sensor-combined electrostatic measurement potential sensor (B) comprising:
   a potential sensor (3) measuring an amount of static electricity of an electrified body (11);
   a displacement sensor (2) sensing a distance to the electrified body (11);
   an integrated casing (1) for integrating the displacement sensor (2) and the potential sensor (3) in one instrument, wherein the displacement sensor (2) and the potential sensor (3) are positioned on the same side;
   a main controller (5) storing measurement values obtained by the displacement sensor (2) and the potential sensor (3), respectively, and correcting an error in a potential value according to the distance;
   a power supply unit (10) supplying power to the main controller (5);
   a display unit (6) displaying a result value obtained by measuring the static electricity;
   a connection cable (4) through which the power is supplied to the displacement sensor (2) and the potential sensor (3) and a control signal is transmitted and received, and
   wherein the potential sensor (3) comprises a diaphragm, and accurately measures the static electricity of the electrified body by applying a value of the distance to the electrified body to an amount of change in a current induced by the diaphragm.

2. An operation method for a displacement sensor-combined electrostatic measurement potential sensor (B) having a distance correction function using an ultrasonic sensor, the operation method comprising:
   applying power wholly to a displacement sensor-combined electrostatic measurement potential sensor;
   adjusting a zero point for setting a measurement reference for the potential sensor, in the absence of an electrified body (11);
   measuring, by an operation of a displacement sensor, a distance between the electrified body and the displacement sensor-combined electrostatic measurement potential sensor;
   measuring electrostatic potential by operating the electrostatic measurement potential sensor that includes a diaphragm positioned facing the electrified body;
   correcting, by a main controller (5), an error in a potential value according to the measured distance between the electrified body and the displacement sensor-combined electrostatic measurement potential sensor;
   outputting a result value through a display unit (6).

3. The displacement sensor-combined electrostatic measurement potential sensor of claim 1, having a function of transmitting a warning alarm to a user when the amount of the static electricity which is equal to or greater than a predetermined reference is measured at the electrified body (11).

* * * * *